(12) United States Patent
Ravi et al.

(10) Patent No.: US 8,207,770 B1
(45) Date of Patent: Jun. 26, 2012

(54) DIGITAL PHASE LOCK LOOP

(75) Inventors: Ashoke Ravi, Hillsboro, OR (US);
Pin-En Su, Fountain Valley, CA (US);
Paolo Madoglio, Beaverton, OR (US);
Georgios Palaskas, Portland, OR (US)

(73) Assignee: Intel Corporation, Santa Clara ( * ) Notice: Subject to any disclaimer, the term of this patent is extended or adjusted under 35 U.S.C. 154(b) by 0 days.

(21) Appl. No.: 12/978,394

(22) Filed: Dec. 23, 2010

(51) Int. Cl.
*H03L 7/06* (2006.01)
(52) U.S. Cl. .............................. 327/159; 327/150; 327/9
(58) Field of Classification Search .................. None
See application file for complete search history.

(56) References Cited

U.S. PATENT DOCUMENTS

| | | | |
|---|---|---|---|
| 6,754,613 B2 * | 6/2004 | Tabatabaei et al. | 702/189 |
| 7,332,973 B2 * | 2/2008 | Lee et al. | 331/25 |
| 7,809,338 B2 * | 10/2010 | Tsfati | 455/76 |
| 7,839,221 B2 * | 11/2010 | Kossel et al. | 331/16 |
| 7,859,344 B2 * | 12/2010 | Uozumi et al. | 331/1 A |
| 7,990,191 B2 * | 8/2011 | Fujino et al. | 327/156 |
| 2009/0112499 A1 * | 4/2009 | Chao et al. | 702/69 |
| 2009/0225631 A1 * | 9/2009 | Shimizu et al. | 368/113 |
| 2010/0134165 A1 * | 6/2010 | Oh et al. | 327/158 |
| 2010/0289541 A1 * | 11/2010 | Wu | 327/158 |

* cited by examiner

*Primary Examiner* — Cassandra Cox
(74) *Attorney, Agent, or Firm* — Kacvinsky Daisak, PLLC

(57) ABSTRACT

An apparatus may comprise a time-to-digital circuit architecture. Other embodiments are described and claimed.

21 Claims, 6 Drawing Sheets

US 8,207,770 B1

DIGITAL PHASE LOCK LOOP

BACKGROUND

In a digital phase locked loop (DPLL) architecture for local oscillator (LO) generation, the voltage controlled oscillator (VCO) phase is typically measured and compared to a high purity low-frequency reference signal using a time-to-digital converter (TDC). The error phase between the VCO and reference signals is filtered and used to set the VCO frequency. In typical implementations of a TDC, a mismatch occurs between buffer cells of the TDC. This mismatch may produce a non-uniform quantization characteristic. As a result, the VCO phase, as measured by the TDC, shows an error that inherits the same periodicity as that of the VCO phase, which in turn is set by the desired ratio between output frequency and reference signal frequency. This periodic error appears in the DPLL output signal spectrum as spurious sidebands around a carrier. Such spurs limit the ability to use a DPLL employing a conventional TDC architecture for frequency generation where high spectral purity is desired.

In addition, the resolution of a TDC is typically not known precisely because the resolution may be process-, voltage-, and temperature dependent. Without knowledge of TDC resolution, the TDC cannot output a number that exactly represents the phase difference between its two inputs, but rather a scaled phase difference between the inputs. The phase wrapping effect in a TDC device serves to periodically reset this incorrect phase difference such that the periodicity appears at the DPLL output signal spectrum as spurious sidebands around the carrier. These spurs further limit the application of a DPLL as a frequency generator where high spectral purity is required, because filtering of such spurs would require a low bandwidth DPLL. It is with respect to these and other considerations that the present improvements have been needed.

DETAILED DESCRIPTION

Various embodiments may be generally directed to systems that employ digital frequency synthesizers. Some embodiments may be particularly directed to architecture for digital phase locked loops.

As digital phase locked loops are more widely deployed, techniques and architecture to enhance their functioning as frequency synthesizers may be desirable. Various embodiments provide improved DPLL performance that reduces the spurs in spectral output that may result from the use of TDCs in a DPLL circuit arrangement.

Some embodiments include DPLLs having a recirculating TDC architecture that eliminates buffer mismatches produced in conventional TDC architecture. Other embodiments may employ a period estimation loop architecture that may be integrated into a DPLL circuit arrangement. Other DPLL embodiments may employ a recirculating TDC architecture in conjunction with a period estimation loop architecture.

Various embodiments may comprise one or more elements. An element may comprise any structure arranged to perform certain operations. Although an embodiment may be described with a limited number of elements in a certain arrangement by way of example, the embodiment may include more or less elements in alternate arrangement as desired for a given implementation. It is worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Figure 1:
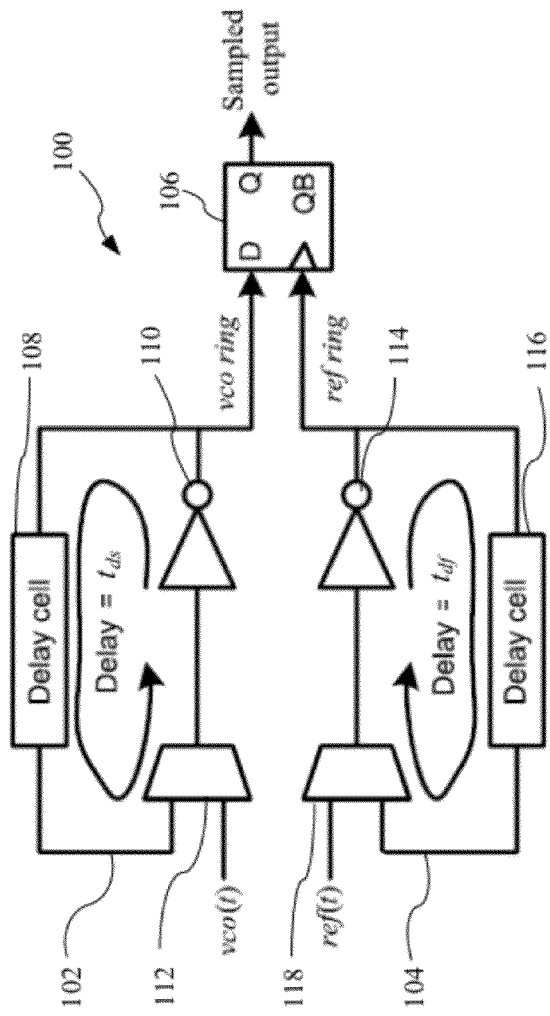
FIG. 1 illustrates one embodiment of a time-to-digital converter.

FIG. 1 illustrates a block diagram of one embodiment of a recirculating TDC 100. In various embodiments, the recirculating TDC 100 may be arranged in a circuit that comprises digital and analog components, or a circuit that comprises only digital components. In particular embodiments, TDC 100 may be arranged in a DPLL. In some embodiments, TDC 100 may be arranged in a DPLL frequency synthesizer. In some embodiments a DPLL frequency synthesizer may be included in a radio receiver, mobile communication device, wireless communication device including WiFi, WiMax, Bluetooth device, and the like.

The recirculating TDC 100 includes a pair of rings 102, 104 that are arranged to receive a pair of signals, such as a voltage controlled oscillator signal (VCO) and a reference signal, respectively, as illustrated in FIG. 1. In some embodiments, the TDC 100 may be arranged to receive a digital controlled oscillator (DCO) signal and a reference signal. Each ring comprises a multiplexer (MUX) 112, 118 that feeds a signal to a respective inverter 110, 114, which, in turn, feed respective inverted signals to inputs of delay cells 108, 116. Each delay cell 108, 116 may be characterized by a respective delay time $t_{ds}$, $t_{df}$, which may be any convenient delay period. In accordance with embodiments of the TDC 100 the delay time $t_{ds}$ of the VCO delay cell 108 differs from the delay time $t_{df}$ of the reference delay cell 108.

The delay cells 108 and 116 may have known components that may comprise, for example, inverters (not shown). In some embodiments, the delay cells 108, 116 are arranged such that the number of inverters in each delay cell are each an even number. Accordingly, each ring 102, 104 may include an odd number of inverters in series including inverters 110, 114. In various embodiments, the delay cells 108, 116 and inverters 110, 114 may comprise CMOS devices having known designs.

The output of delay cells 102, 104 are fed to respective MUX devices 112, 118. In this manner, a VCO signal may be recirculated in ring 102 with a delay corresponding to $2t_{ds}$ in each period of circulation and a reference signal may be recirculated in ring 102 with a delay corresponding to $2t_{df}$ in each period of circulation. In particular, each ring may act as a ring oscillator in which the respective signals that are output by inverters 110, 114 are inverted after each period of circulation.

Signals output by VCO ring 102 may be fed to flip-flop 106. Signals output by reference ring 104 may also be fed to flip-flop 106. Is some embodiments flip-flop 106 may comprise a D-flip-flop. In one embodiment depicted in FIG. 1, the data input to flip-flop 106 is from the VCO ring 102 while the clock pin receives input from the reference ring 104. In some embodiments, the flip-flop 106 may be edge triggered, as depicted in FIG. 1. In another embodiment, the VCO ring signal may be used to trigger the reference ring signal.

In one embodiment D-flip-flop 106 may sample the outputs from rings 102, 104 and detect a zero-to-one transition. By determining the number of reference ring stages from the time the rising edge of the reference ring is detected until the zero-to-one transition is detected, TDC 100 may provide a quantized calculation of the phase delay between reference and VCO signals.

As detailed further below, the TDC 100 circuit architecture calculates the phase delay of a VCO signal while avoiding the mismatch problem in conventional TDCs or in Vernier TDCs, which both exhibit buffer mismatches between stages. Instead, TDC 100 is arranged to recirculate a reference and VCO signal in respective reference and VCO ring oscillators, which each provide the same inverter and delay cell for their respective signals for each stage, thereby eliminating the buffer mismatch problem.

Figure 2:
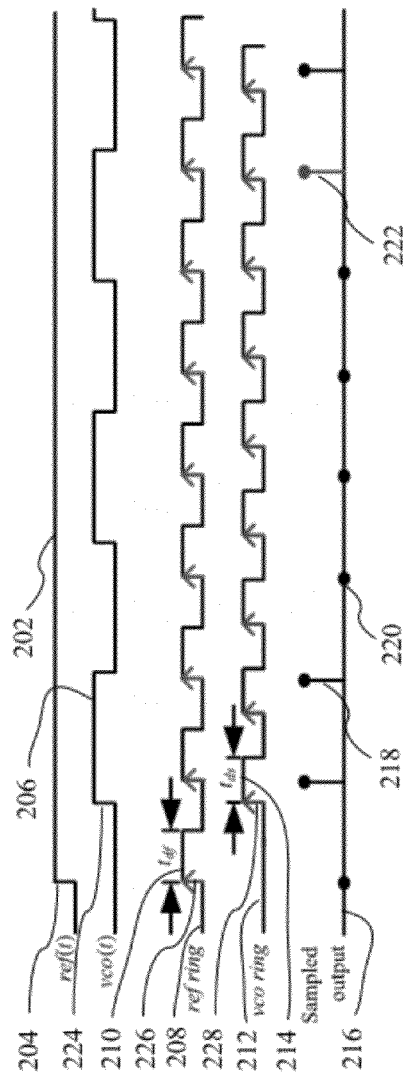
FIG. 2 illustrates one exemplary output of the time-to-digital converter of FIG. 1.

FIG. 2 depicts exemplary signals that may be generated in some TDC embodiments, such as the TDC of FIG. 1. With reference also to FIG. 1, the reference signal ref(t) 202 may represent a signal fed to reference ring 104 and the VCO signal vco(t) 206 may represent a signal fed to VCO ring 102. In operation, TDC 100 may provide an output that represents the phase delay between the reference signal 202 and VCO signal 206. This TDC output may be used to adjust an oscillator in a DPLL in a manner that facilitates producing an output spectrum without spurs that are characteristic of known TDCs used in DPLL circuits. In particular, the recirculated reference signals 208 and VCO signals 212 generate sampled output 216, which results in a detected transition in flip-flop 106 when the signals converge.

In some embodiments, the rising edge 204 of the reference signal arrives before that of the VCO signal 224, as depicted in FIG. 2. In an embodiment depicted in FIG. 2, the reference ring delay period $2t_{df}$ 210 is longer than the VCO ring delay period ring delay period $2t_{ds}$ 214. Because the delay in ring 102 is less, the rising edge 228 of the recirculated VCO signal eventually catches up with the rising edge 226 of the recirculated reference signal after a fixed amount of periods.

Before the VCO rising edge 228 catches up to the reference ring rising edge 226, sampled outputs 218 and 220 do not detect a zero-to-one transition. Once the VCO ring rising edge catches up to the reference ring rising edge, a sampled output 222 produces a zero-to-one detection. TDC 100 may accordingly output a number corresponding to the number N of reference ring oscillating periods that have elapsed (elapsed reference ring periods) between detection of the first rising edge 204 in the reference signal and the time of sampled output 222 when the zero-to-one output at flip-flop 106 occurs.

The quantized time duration between arrival of ref(t) 204 and VCO(t) 224 may be calculated as the product of the number N of elapsed reference ring periods output by the TDC and the TDC resolution, the latter of which is given by a difference in the absolute values of the VCO and reference periods 2|tds−tdf| for the architecture of TDC 100. In various embodiments, this value, 2N|tds−tdf|, may be used to adjust the VCO frequency in a DPLL circuit.

In order for the TDC circuit 100 of FIG. 1 to output respective reference and VCO signals whose rising edges converge, the embodiment of FIG. 2 provides a later arriving signal (VCO) with a shorter delay period. In accordance with some embodiments, a circuit architecture may be provided that ensures that a later arriving signal has a shorter delay period. In this manner, the recirculated VCO and reference signals are ensured of converging after N stages, wherein the TDC flip-flop detects a zero-to-one transition.

Figure 3:
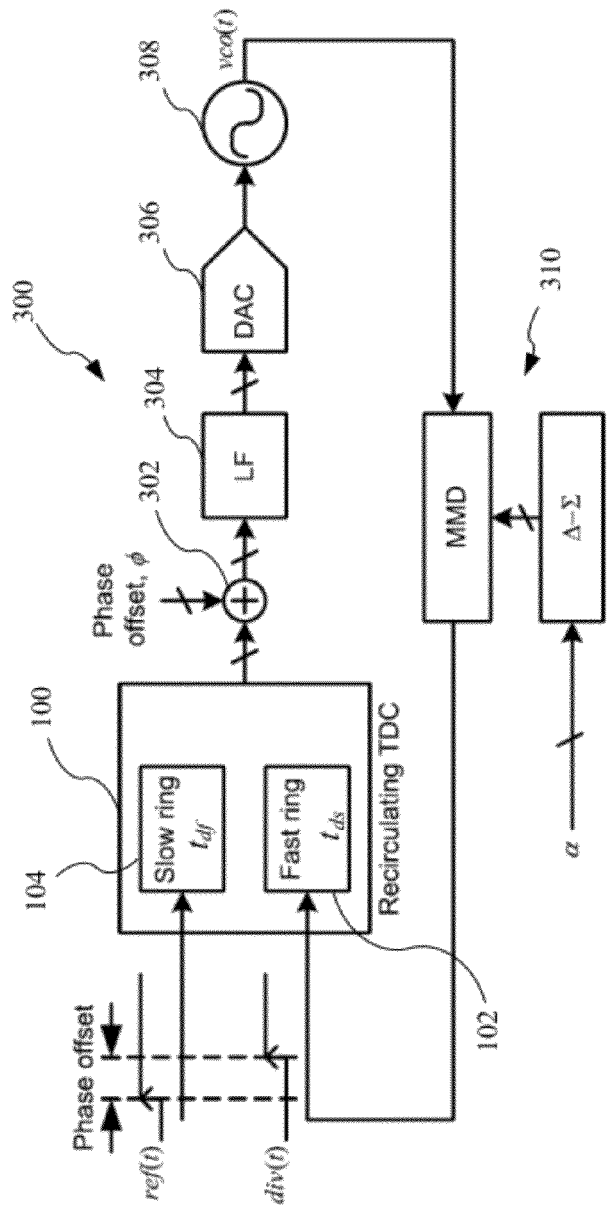
FIG. 3 illustrates one embodiment of a digital phase locked loop circuit.

FIG. 3 depicts an exemplary DPLL. In the illustrated embodiment shown in FIG. 3, a DPLL circuit 300 is arranged to ensure that a faster ring 102 of the recirculating TDC is provided with a later-arriving signal. FIG. 3 depicts the fast ring as VCO ring 102, which may operate as described hereinabove. DPLL circuit 300 includes an adder 302 that may receive an output from TDC 100 and add a phase offset φ to the output signal before it is received in loop filter 304, which may be a known loop filter. DPLL circuit 300 may also include a digital-to-analog converter (DAC) and tunable oscillator 308, which may be arranged in series with a multimodulus divider (MMD) 310. The MMD may be operable to output a signal to an input of VCO ring 102.

MMD 310 may be arranged as a Δ-Σ modulated multimodulus divider, as depicted in FIG. 3. In operation MMD 310 may select one of many output VCO signal rising edges and send the selected rising edge to TDC 100 for conversion, as described above with respect to FIGS. 1 and 2. Circuit 300 may be arranged to add the phase offset φ to a VCO signal in such a manner that the rising edge output from MMD 310 has a desired phase relationship with a reference signal ref(t) that is input to ring 104. For DPLL circuit 300 to be in the locked state, the input to loop filter 304 must be driven to zero, thereby ensuring that the phase offset φ causes the rising edge of the VCO signal div(t) to be delayed with respect to ref(t).

Figures 4A, 4B:
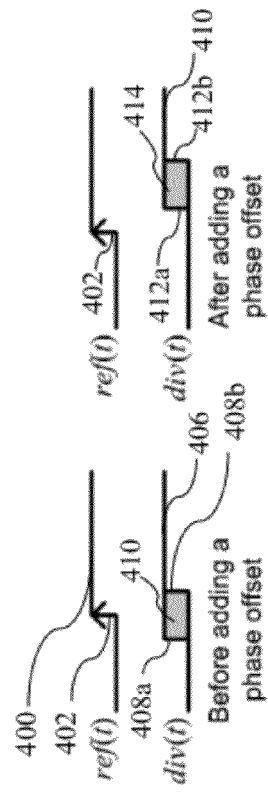
FIGS. 4A and 4B illustrate operation of the digital phase locked loop circuit of FIG. 3.

FIGS. 4A and 4B depict the result of a phase offset operation that may be provided by an embodiment using DPLL 300. Rising edge 402 of ref(t) signal 400 is depicted as fixed in phase space. In the range of scenarios illustrated in FIG. 4a, before a phase offset φ is added, the rising edge 408 of VCO signal div(t) 406 may occur over a range of phase space 410, which may be equal to the VCO signal 206 period $T_{VCO}$ In this manner, the rising edge 408 may occur before 408a or after 408b rising edge 402. In the scenario depicted by rising edge 408a, if the div(t) edge arrives earlier than the ref(t) edge, the rising edges may not properly converge. On the other hand, when phase offset φ is added, the rising edge 412 of offset VCO signal div(t) 410 may occur over a range of phase space 414 that may be equal to the $T_{VCO}$. However, the offset φ is sufficient that both the latest possible rising edge 412b and earliest possible rising edge 412a both occur after reference rising edge 402, thereby ensuring convergence of the rising edges.

In other embodiments, convergence of a VCO and reference signal in a recirculating TDC may be arranged by providing a slower VCO ring in which a feedback signal rising edge arrives earlier than the reference rising edge. This may be accomplished in one embodiment by arranging VCO ring 102 to be slower than reference ring 104 and by providing a phase offset to the ref(t) signal. Accordingly, the faster reference rising edge is forced to arrive after the div(t) rising edge, ensuring that the reference and div(t) rising edges converge.

In one embodiment, in order to pull a DPLL such as DPLL 300 within dynamic range of a TDC, such as TDC 100, a simple counter may be used to handle large initial phase errors.

Figure 9:
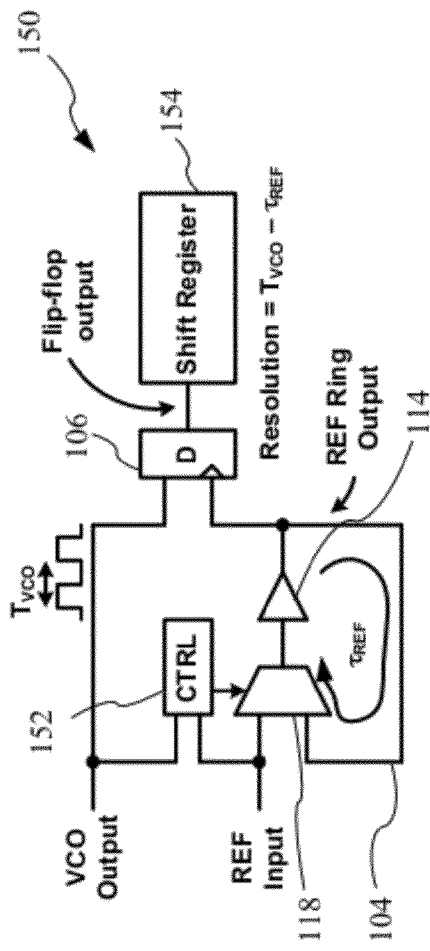
FIG. 9 illustrates an embodiment of a time-to-digital converter which directly compares a VCO signal against output of a single ring oscillator

FIG. 9 depicts a further embodiment of a recirculating TDC 150. In this embodiment, a reference signal may be recirculated with a reference period $\tau_{REF}$ through reference ring oscillator circuit 104 similar to that described above with respect to FIG. 1. A VCO signal having a period $T_{VCO}$ may be fed to flip-flop 106. As illustrated, control logic 152 may send signals to MUX 118 to control the input to inverter 114, such that the input is switched between the recirculated reference signal in ring 104 and the reference input (REF input).

Figure 10:
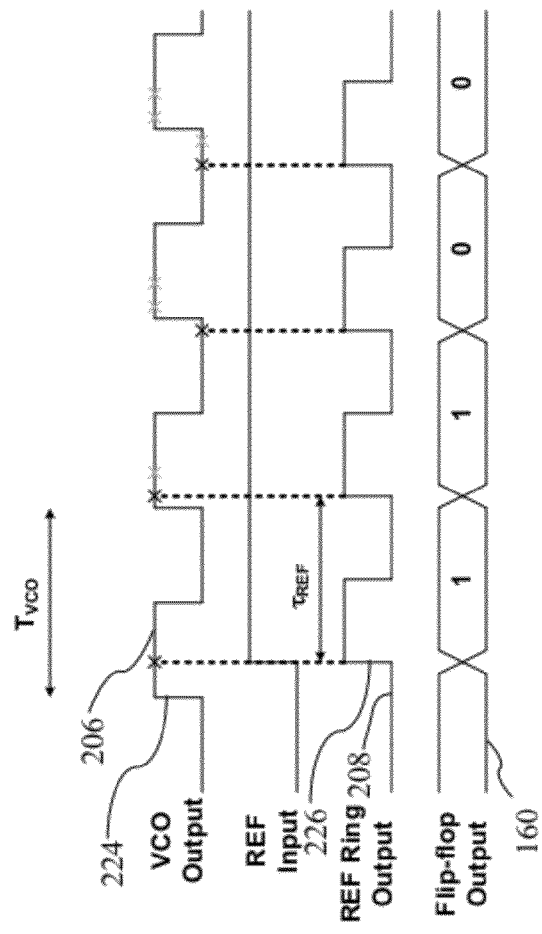
FIG. 10 illustrates exemplary timing diagrams of the embodiment in FIG. 9.

FIG. 10 depicts exemplary signals that may be generated in some TDC embodiments, such as the TDC of FIG. 9. With reference also to FIG. 9, the flip-flop output signal 160 samples the rising edge 226 of the reference signal and may initially output a "1" when the VCO signal is high, as depicted in FIG. 10. Eventually, the reference ring signal may overtake the rising edge of the VCO signal 224 and output a "0" as shown. Shift register 154 may then latch the output of flip-flop 106 for further processing. The quantized time duration between arrival of ref(t) 204 and VCO(t) 206 may be calculated as the product of the number N of elapsed reference ring periods output by the TDC and the TDC resolution, $|T_{VCO} - \tau_{REF}|$. In one example, $\tau_{REF}$ may be designed to be (63/64) $T_{VCO}$. As with the aforementioned embodiments, the duration of the reference and VCO periods may be arranged so that the later arriving signal corresponds to the signal having the shorter period.

In other embodiments, the resolution of a TDC may be estimated using a circuit arrangement and method that estimates a period of the VCO. In some embodiments, the VCO period estimation is operable to return a number M that represents the ratio of the VCO period to the TDC resolution. In some embodiments, the resolution of a conventional TDC, such as a linear TDC or a Vernier TDC, may be estimated. In this manner, the TDC resolution can be calculated based upon the returned value of M. This may ensure that a TDC can output a number that represents the phase difference between its two inputs.

Figure 5:
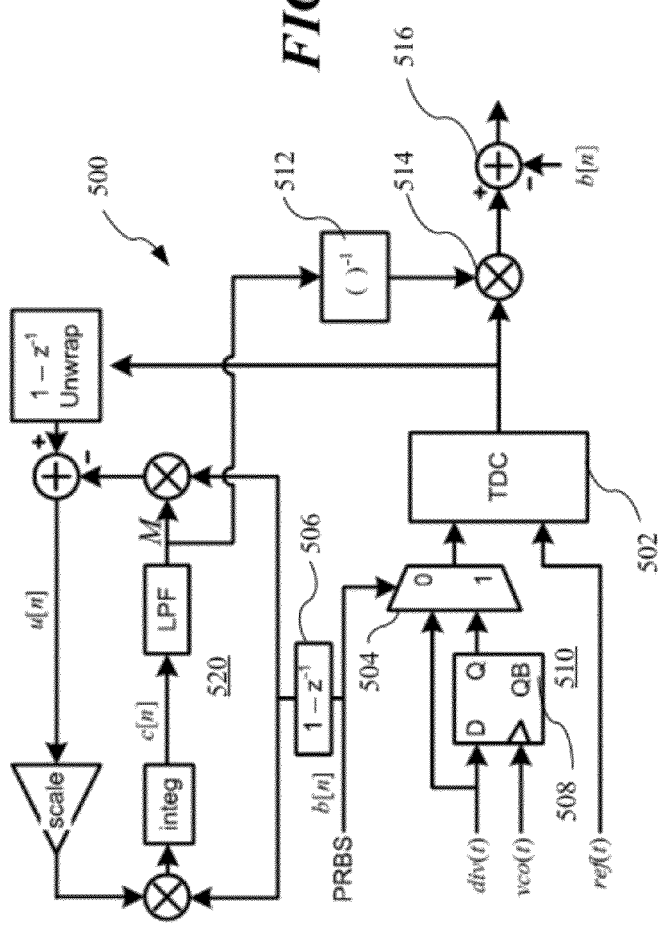
FIG. 5 illustrates one embodiment of a period estimation loop circuit.

In one embodiment, a divider-assisted DPLL circuit architecture may be used to implement a VCO period estimation process. As depicted in FIG. 5, a TDC resolution estimating circuit 500 includes a delay circuit 510 and period estimation loop 520. In some embodiments, delay circuit 510 may be arranged to delay a received feedback signal by one VCO period, as described below.

Delay circuit 510 includes a D-flip-flop 508, which may receive a VCO signal VCO(t) and a DPLL feedback divider signal div(t). The divider signal may be fed to MUX 504, which outputs a signal to a TDC 502. The MUX 504 may be also arranged to receive an output signal from D-flip-flop 508. The select input of MUX 504 may receive a pseudo random bit sequence (PRBS), b[n] 506. In this manner, the feedback divider signal div(t) may be randomly delayed by one VCO period according to the pseudo-random bit sequence received from a generator (not shown). In one embodiment, as illustrated in FIG. 5, the delay of one VCO period may be accomplished by sampling the divider output with the VCO signal.

In another embodiment, the delay of one VCO period may be accomplished by selectively incrementing the division modulus in a multi-modulus divider.

In one embodiment, the TDC output may be sent to VCO period estimation loop 520 for unwrapping. This may be accomplished by running an estimation loop in the frequency domain, in which the unwrapped phase is differentiated $(1-z^{-1})$ to extract frequency. If the TDC input is delayed by one VCO period, the unwrapped output may be subtracted by an estimated VCO period number+/−M. If the estimated VCO period number M is incorrect, the subtraction output u[n] will contain a residual error. In the embodiment of FIG. 5, VCO period estimation loop 520 may scale and multiply the error with its corresponding random sequence b[n], and then accumulate the result. The PRBS b[n] may also be differentiated accordingly when used in the VCO period estimation loop. This effectively calculates the correlation between u[n] and b[n]. The accumulated result c[n] may be smoothed by a digital low-pass filter whose output may be used to update the VCO period number M. Once the VCO period number M converges, u[n] contains no residue of b[n]. As a result, the correlation output c[n] may remain relatively constant so that M averages to the target VCO period number.

In some embodiments, TDC 502, which interacts with delay circuit 510 and VCO period estimation loop 520, may be a conventional TDC that exhibits a known quantization error, as discussed above. Because of this quantization error, the estimated output M may fluctuate about a correct mean value over time.

In other embodiments, instead of a divider-assisted architecture, the VCO period estimation loop 520 may be used in a counter-assisted DPLL architecture. In such architecture, the feedback signal may be a VCO signal that contains a series of rising edges in a reference period. In this case, a TDC, such as a Vernier or a conventional TDC may be designed to have a large enough conversion range.

Figure 6:
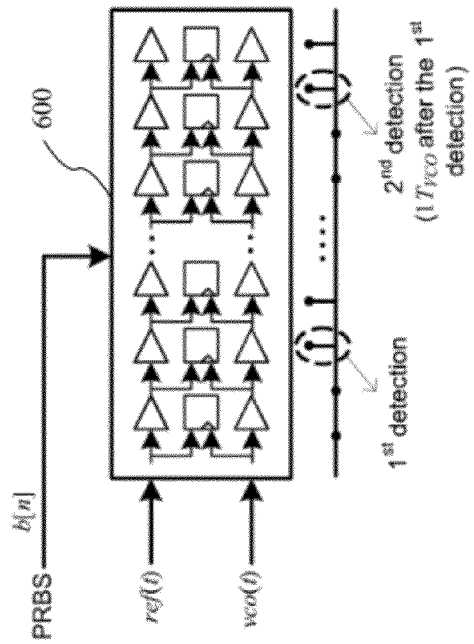
FIG. 6 illustrates one embodiment of a time-to-digital converter of the circuit of FIG. 5.

FIG. 6 depicts a TDC 600 that may be employed in some embodiments with period estimation loop 520 to estimate TDC resolution. This may be accomplished by adding a delay of one VCO period using TDC 600. Instead of detecting a first VCO rising edge, an embodiment of VCO 600 may be arranged to detect a second VCO rising edge corresponding to a delay of one VCO period. In some embodiments, as depicted in FIG. 6, TDC 600 may be designed with a sufficient amount of stages such that a second edge detection occurs within the TDC. Accordingly, the second edge detection may be used as an output from the TDC when a delay in the feedback signal of one VCO period is required.

In some embodiments, the recirculating TDC architecture may be used in microprocessors and in wireless communication circuits, as well as any circuits capable of generating multi-phase clock signals. Embodiments of the recirculating TDC and of the period estimation loop may be used in frequency synthesizers for wireless data standards, such as WiFi, WiMax and 3G-LTE.

Figure 7:
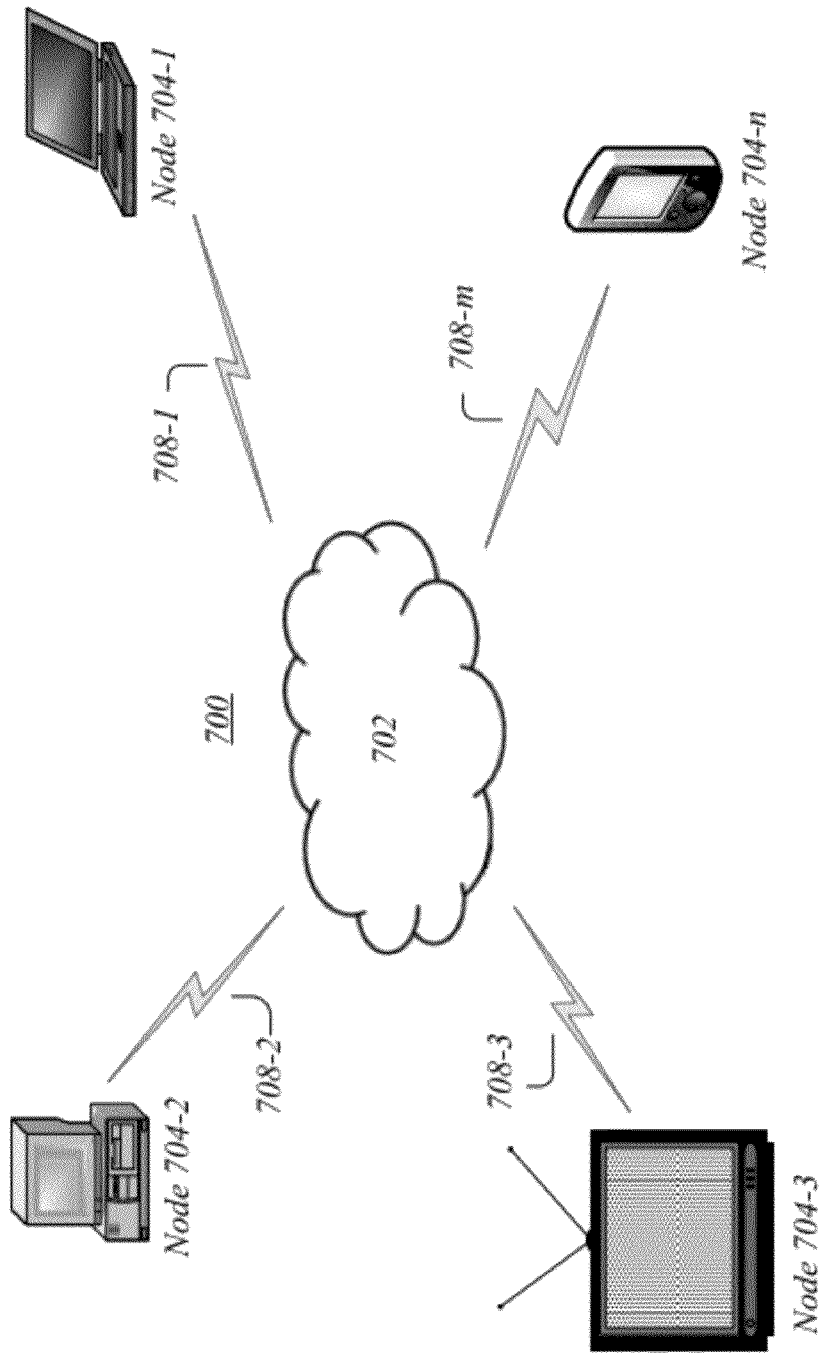
FIG. 7 illustrates one embodiment of a communications system.

FIG. 7 illustrates a block diagram of one embodiment of a communications system 700 that may incorporate the TDC 300 and/or TDC resolution estimating circuit 500. As shown in FIG. 7, the communications system 700 may comprise a network 702 that communicates over links 708-m with a plurality of nodes 704-n, where m and n may represent any positive integer value. In various embodiments, the nodes 704-n may be implemented as various types of wireless devices. Examples of wireless devices may include, without limitation, a station, a subscriber station, a base station, a wireless access point (AP), a wireless client device, a wireless station (STA), a laptop computer, ultra-laptop computer, portable computer, personal computer (PC), notebook PC, handheld computer, personal digital assistant (PDA), cellular telephone, combination cellular telephone/PDA, smartphone, pager, messaging device, media player, digital music player, set-top box (STB), appliance, workstation, user terminal, mobile unit, consumer electronics, television, digital television, high-definition television, television receiver, high-definition television receiver, and so forth.

In some embodiments, the nodes 704-n may comprise one more wireless interfaces and/or components for wireless communication such as one or more transmitters, receivers, transceivers, radios, chipsets, amplifiers, filters, control logic, network interface cards (NICs), antennas, antenna arrays, modules and so forth.

Figure 8:
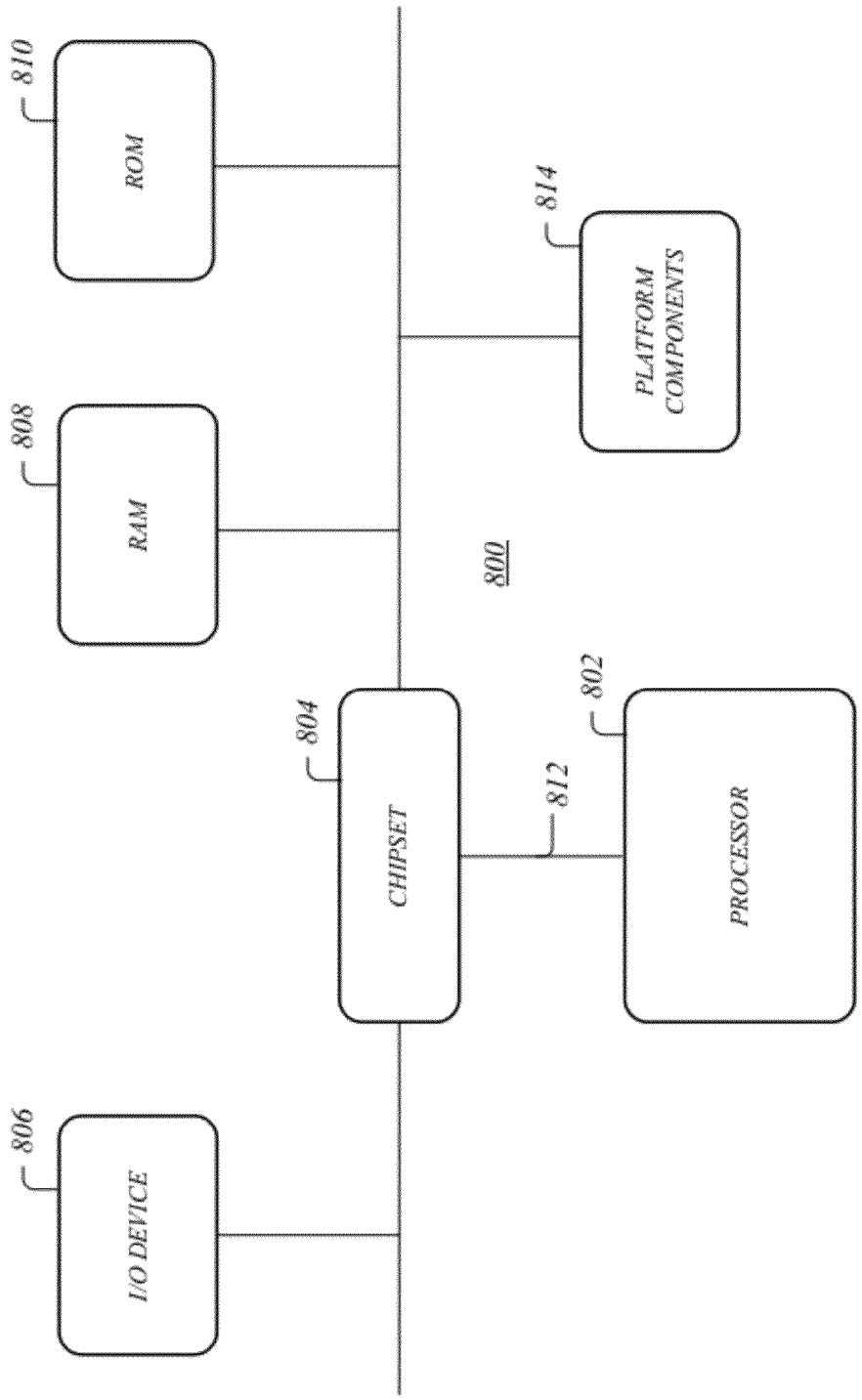
FIG. 8 illustrates one embodiment of a computing system.

FIG. 8 is a diagram of an exemplary computing system embodiment. In particular, FIG. 8 is a diagram showing a system 800, which may include various elements. As shown in FIG. 8, I/O device 806, RAM 808, and ROM 810 are coupled to processor 802 by way of chipset 804. Chipset 804 may be coupled to processor 802 by a bus 812. Accordingly, bus 812 may include multiple lines. In various embodiments, components of system 800 may be clocked by DPLL signals generated in accordance with the TDC 100 and/or TDC resolution estimating circuit 500. The embodiments, however, are not limited to these elements.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a computer-readable medium or article which may store an instruction or a set of instructions that, if executed by a computer, may cause the computer to perform a method and/or operations in accordance with the embodiments. Such a computer may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
a digital phase locked loop circuit (DPLL) having a time-to-digital converter (TDC), the TDC comprising:
a first ring comprising a first delay cell and an inverter arranged to receive a reference signal, the reference signal circulating in the reference ring over one or more stages that each comprise a reference delay period $2t_{df}$;
a second ring comprising a second delay cell and an inverter arranged to receive from a voltage controlled oscillator (VCO) a VCO signal having a phase delay with respect to the reference signal, the VCO signal circulating in the second ring over one or more stages that each comprise a VCO delay period $2t_{ds}$ that is different from the reference delay period; and
a flip-flop circuit coupled to outputs of the first and second rings, the flip-flop circuit arranged to periodically sample first and second outputs from the first and the second ring, respectively, wherein the phase delay is determined by an amount N of reference delay periods elapsed between when a first reference signal is detected and when an output of the flip-flop corresponds to a zero to one or one to zero transition.

2. The apparatus of claim 1, wherein the DPLL circuit is arranged to provide a later-arriving signal of the VCO and reference signals to a ring having a shorter delay period.

3. The apparatus of claim 2, wherein the DPLL is arranged to delay the VCO signal, wherein the reference signal is received at the first ring before the VCO signal is received at the second ring, and wherein $2t_{ds} < 2t_{df}$.

4. The apparatus of claim 1, the DPLL circuit further comprising:
an adder coupled to an input of a loop filter of the DPLL circuit and arranged to add a phase offset to the output of the TDC; and
a multi-modulus divider whose input is coupled to an output of the VCO and whose output is coupled to the input of the second ring.

5. The apparatus of claim 1, wherein the DPLL circuit is arranged to adjust a frequency of the VCO according to the phase delay, the phase delay equal to a product of $N \times 2|t_{ds}-t_{df}|$, wherein $2|t_{ds}-t_{df}|$ is TDC resolution.

6. The apparatus of claim 1, further comprising:
a VCO delay circuit arranged to add a delay equal to one VCO period into the VCO signal received by the TDC; and
a period estimation loop arranged to unwrap an output from the TDC, wherein the period estimation loop converges on a number M, wherein M is equal to a ratio of the VCO period to TDC resolution.

7. A method of measuring a phase delay of a voltage controlled oscillator (VCO) signal of a digital phase locked loop (DPLL) circuit, comprising:
circulating a reference signal in a first ring oscillator circuit of a time-to-digital converter (TDC), the first ring oscillator circuit arranged with a reference delay period $2t_{df}$;
circulating the VCO signal in a second ring oscillator circuit of the TDC, the second ring oscillator circuit arranged with a VCO delay period $2t_{ds}$ that is different from the reference delay period;
counting a number N of reference delay periods from when a first reference signal is detected and when an output of a flip-flop that samples the VCO and reference signals corresponds to a zero to one transition; and
determining the phase delay according to $N \times 2|t_{ds}-t_{df}|$.

8. The method of claim 7, further comprising providing a later arriving signal of the VCO and reference signals to a ring having a shorter delay period.

9. The method of claim 8, wherein $2t_{ds} < 2t_{df}$, the method further comprising:
adding a phase offset to an output of the TDC before the output enters a loop filter of the DPLL;
receiving an output signal of the VCO containing the phase offset at a multimodulus divider; and
sending a rising edge of the output signal having the phase offset to the second ring.

10. The method of claim 7, further comprising adjusting a frequency of the VCO according to the determined phase delay.

11. The method of claim 7, wherein the counting the number N of reference delay periods comprises sampling a rising edge of the reference signal in a D-flip-flop to determine the zero to one transition.

12. The method of claim 7, further comprising:
adding a delay equal to one VCO period ($T_{VCO}$) into the VCO signal before the VCO signal is received by the TDC; and
unwrapping the output of the TDC in a loop circuit that converges on a value M equal to $T_{VCO}/(2|t_{ds}-t_{df}|)$.

13. A communications system, comprising:
a wireless interface that comprises a digital phase locked loop (DPLL) having a time-to-digital converter (TDC) for comparing phase difference between a voltage controlled oscillator (VCO) signal and a reference signal, the TDC comprising:
a first ring comprising a first delay cell and an inverter arranged to receive the reference signal, the reference signal circulating in the reference ring over one or more stages that each comprise a reference delay period $2t_{df}$;
a second ring comprising a second delay cell and an inverter arranged to receive the VCO signal, the VCO signal circulating in the second ring over one or more stages that each comprise a VCO delay period $2t_{ds}$ that is different from the reference delay period; and
a flip-flop that uses output from the first ring to sample output from the second ring, wherein the phase delay is determined by an amount N of reference delay periods elapsed between when a first reference signal is detected and when an output of the flip-flop corresponds to a zero to one transition.

14. The communications system of claim 13, wherein the wireless interface comprises one of: a transmitter, a receiver, and a transceiver.

15. The communications system of claim 13, wherein the system comprises one or more of:
a wireless access point, a wireless client device, a wireless station, a laptop computer, ultra-laptop computer, portable computer (PC), personal computer, notebook PC, handheld computer, personal digital assistant (PDA), cellular telephone, combination cellular telephone/PDA, smartphone, pager, messaging device, media player, digital music player, set-top box, appliance, workstation, user terminal, mobile unit, consumer electronics, television, digital television, high-definition television, television receiver, and a high-definition television receiver.

16. The communications system of claim 13, wherein the wireless interface comprises a wireless communications integrated circuit that includes a frequency synthesizer controlled by the DPLL.

17. The communications system of claim 13, wherein the DPLL is arranged to delay the VCO signal, wherein the reference signal is received at the first ring before the VCO signal is received at the second ring, and wherein $2t_{ds} < 2t_{df}$.

18. The communications system of claim 13, the DPLL further comprising:
an adder coupled to an input of a loop filter of the DPLL circuit and arranged to add a phase offset to the output of the TDC; and
a multi-modulus divider whose input is coupled to an output of the VCO and whose output is coupled to the input of the second ring.

19. The communications system of claim 13, wherein the DPLL circuit is arranged to adjust a frequency of the VCO according to the phase difference, the phase difference equal to a product of $N \times 2|t_{ds}-t_{df}|$, wherein $2|t_{ds}-t_{df}|$ is TDC resolution.

20. The communications system of claim 13, the DPLL further comprising:
a VCO delay circuit arranged to add a delay equal to one VCO period into the VCO signal received by the TDC; and
a period estimation loop arranged to unwrap an output from the TDC, wherein the period estimation loop converges on a number M, wherein M is equal to a ratio of the VCO period to TDC resolution.

21. A method of measuring a phase delay of a voltage controlled oscillator (VCO) signal of a digital phase locked loop (DPLL) circuit, comprising:
circulating a reference signal in a ring oscillator circuit of a time-to-digital converter (TDC), the ring oscillator circuit arranged with a reference delay period $\tau_{REF}$ that is different than a period $T_{VCO}$ of the VCO;
sending an output of the ring oscillator circuit and the VCO signal to a flip-flop for sampling;
counting a number N of reference delay periods from when a first reference signal is detected and when an output of the flip-flop corresponds to a transition between zero and one; and
determining the phase delay according to $N \times |T_{VCO}-\tau_{REF}|$.

* * * * *

UNITED STATES PATENT AND TRADEMARK OFFICE
CERTIFICATE OF CORRECTION

| | | |
|---|---|---|
| PATENT NO. | : 8,207,770 B1 | |
| APPLICATION NO. | : 12/978394 | |
| DATED | : June 26, 2012 | |
| INVENTOR(S) | : Ashoke Ravi et al. | |

It is certified that error appears in the above-identified patent and that said Letters Patent is hereby corrected as shown below:

In column 9, line 34, in claim 9, delete "multimodulus" and insert -- multi-modulus --, therefor.

Signed and Sealed this
Eleventh Day of September, 2012

David J. Kappos
*Director of the United States Patent and Trademark Office*